United States Patent [19]

Soo

[11] Patent Number: 4,987,373

[45] Date of Patent: Jan. 22, 1991

[54] MONOLITHIC PHASE-LOCKED LOOP

[75] Inventor: David C. Soo, Milpitas, Calif.

[73] Assignee: Chrontel, Inc., Milpitas, Calif.

[21] Appl. No.: 402,214

[22] Filed: Sep. 1, 1989

[51] Int. Cl.$^5$ .................. H03L 7/00; G01R 1/00
[52] U.S. Cl. .................................. 328/155; 331/14;
331/25; 307/511
[58] Field of Search .................. 328/155, 133, 134;
307/262, 511; 331/25, 14, DIG. 2; 375/120

[56] References Cited

U.S. PATENT DOCUMENTS

| 4,034,310 | 7/1977 | Coe | 331/DIG. 2 |
|---|---|---|---|
| 4,122,404 | 10/1978 | Fuhrman | 328/155 |
| 4,375,693 | 3/1983 | Kuhn | 307/511 |
| 4,642,489 | 2/1987 | Wilcox | 307/514 |
| 4,652,834 | 3/1987 | McAdam | 375/120 |
| 4,743,857 | 5/1988 | Childers | 331/25 |
| 4,780,759 | 10/1988 | Matsushima et al. | 375/120 |
| 4,801,896 | 1/1989 | Phillips et al. | 331/25 |
| 4,888,564 | 12/1989 | Ishigaki | 331/1 A |
| 4,918,403 | 4/1990 | Martin | 331/1 A |

OTHER PUBLICATIONS

Best, Roland E., Phase-Locked Loops, Theory, Design and Applications, McGraw-Hill, pp. 7-14 (1984).
Egan, William, Frequency Synthesis by Phase Lock, John Wiley & Sons, Chapters 5 and 7 (1981).
Giebel, B., Lutz, J., and O'Leary, P. L., "Digitally Controlled Oscillator," *IEEE Journal of Solid State Circuits* vol. 24, No. 6, pp. 640-645 (Jun. 1989).
Gregorian, R., Martin, K. W., Temes, G. C., "Switched-Capacitor Circuit Design," *Proceedings of the IEEE,* vol. 71, No. 8, pp. 941-966 (Aug. 1983).
Jacobs, G. M., Allstat, D. J., Brodersen, R. W., Gray, P. R., "Design Techniques for MOS Switched Capacitor Ladder Filter," *IEEE Trans. Circuits & Syst.* vol. CAS-25, #12, pp. 1014-1021, Dec. 1978.

Signetics HCMOS Products Specifications, 74HC/HCT7046A, pp. 7-961 et seq. (Jul. 28, 1988).

Primary Examiner—Stanley D. Miller
Assistant Examiner—Yen Nguyen
Attorney, Agent, or Firm—Flehr, Hohbach, Test, Albritton & Herbert

[57] ABSTRACT

A phase-locked loop (PLL) circuit, manufacturable using standard integrated circuit technology, includes a sampled-data phase detector, a sampled-data loop filter for filtering the output of the phase detetector, a voltage controlled oscillator driven by the output of the loop filter, and a frequency divider in the feedback loop. A clock circuit generates reference signals needed by the other circuit components. The sampled-data phase detector, under the control of two clocks of differing frequencies, derives a phase error signal through the use of discrete-time analog integration of its input signal. When the PLL is in lock, this phase detector outputs valid phase error signal at discrete time intervals. The gain of the phase detector is proportional to a ratio of capacitor values, a ratio of frequencies, and a reference voltage, all of which can be made substantially independent of variations in temperature and semiconductor processing. A separate frequency acquisition circuit is used to prevent false locking of the PLL on an erroneous frequency. The outputs of this frequency acquisition circuit are fed to the loop filter by a switched-capacitor circuit arrangement that automatically removes the frequency acquisition circuit from the feedback loop once frequency acquisition has been achieved. The sampled-data loop filter emulates the response of continuous-time filters by replacing resistors with switched capacitors. The loop filter response is, to first order, a function only of capacitor ratios and the frequency of a reference clock.

24 Claims, 10 Drawing Sheets

MONOLITHIC PHASE-LOCKED LOOP

The present invention relates generally to phase-locked loop circuits, especially as used in frequency synthesis circuits, and particularly to a monolithic integrated circuit for frequency synthesis.

BACKGROUND OF THE INVENTION

The primary object of the present invention is to provide a monolithic integrated circuit for frequency synthesis using a phase-locked loop without the use of external filter components such as capacitors and resistors.

The following terminology will be used to distinguish between clock signals, the frequencies of clock signals, and the clock period of such clock signals. Clock signals, such as $F_X$ are denoted with a signal name starting with a capital F. The frequency of clock $F_X$ is denoted $f_X$ and the clock period of clock $F_X$ is denoted $T_X$, which is equal to $1/f_X$.

Figure 1:
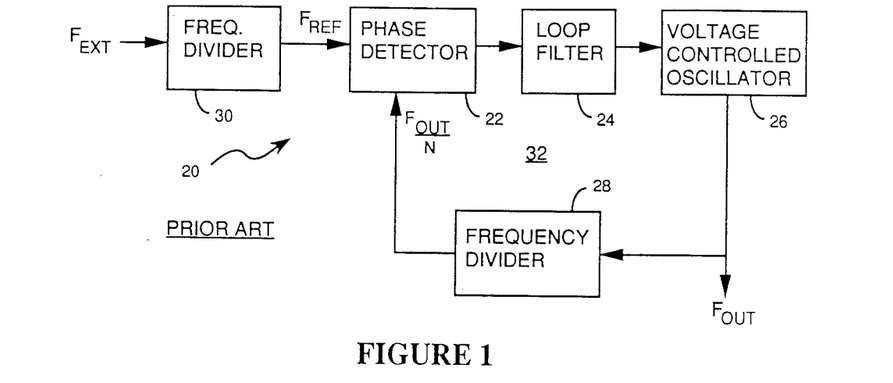
FIG. 1 is a block diagram of a standard, prior art phase-locked loop circuit.

FIG. 1 shows a block diagram of a typical frequency synthesizer 20. The synthesizer 20 consists of a phase detector 22, a loop filter 24, a voltage controlled oscillator (VCO) 26 and two frequency dividers 28 and 30. Components 22 through 28 form a conventional phase-locked loop (PLL) 32. When the synthesizer is in lock, the specified output frequency is $$f_{OUT} = N * f_{REF} = N * f_{EXT}/M \quad \text{(Eq. 1)}$$

where M and N are the divisors of the frequency dividers 28 and 30, respectively. M and N are typically integers. The reference frequency, $f_{REF}$, is generated by dividing an external reference frequency, $f_{EXT}$, by M. The specified clock $F_{REF}$ by means of the phase-locked loop (PLL) 32. The specified output frequency can be adjusted by digitally varying (i.e., programming) the value of N. Therefore, the minimum increment by which $f_{OUT}$ can be changed, i.e., the resolution of the frequency synthesizer 20, is simply the reference frequency, $f_{REF}$.

The phase detector 22 in the synthesizer 20 depicted in FIG. 1 is typically realized using one of several well known circuits. In general, the average (dc) output signal is proportional to the phase difference between the input signals $F_{REF}$ and $F_{OUT/N}$. However, the phase detector 22 typically also produces strong signal components at multiples of the reference frequency. These harmonics must be removed from the input to the VCO 26 by a loop filter 24 to prevent the generation of excessive phase noise at the synthesizer's output.

Figure 2:
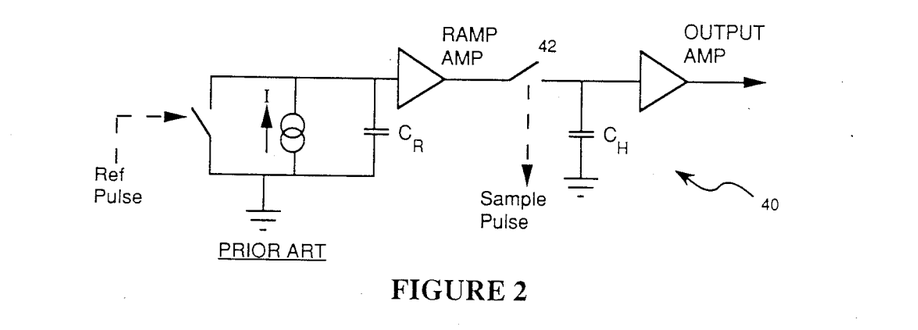
FIG. 2 depicts a prior art phase detector.
Figure 3:
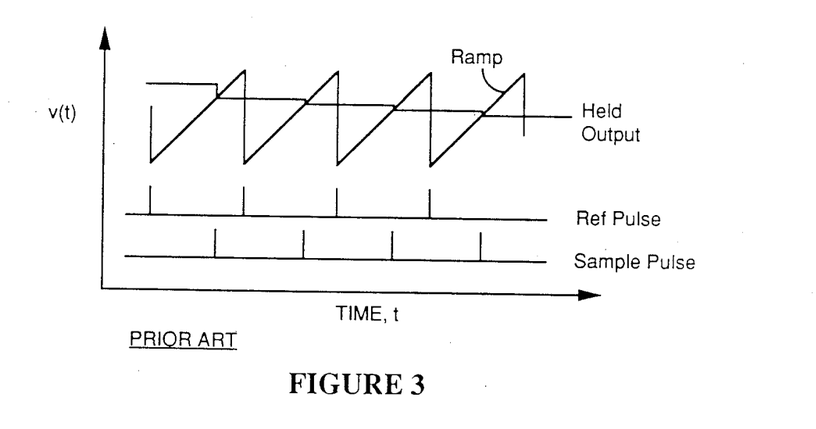
FIG. 3 is a timing diagram for the phase detector shown in FIG. 2.

An example of a prior art phase detector that does not produce signals at multiples of $F_{REF}$ is shown in FIG. 2. A timing diagram for the circuit in FIG. 2 is shown in FIG. 3. In this phase detector 40, capacitor $C_R$ is used to integrate a current signal I periodically, resulting in a sawtooth voltage waveform across the capacitor. The phase error voltage v(t) is derived by sampling the sawtooth waveform via a sampling switch 42. The sampled voltage is then held on the hold capacitor $C_H$ until the next sample is taken. Unfortunately, the phase detector in FIG. 2 cannot be easily implemented monolithically, especially when the reference frequency is lower than a few kilohertz. For example, if a current signal as low as 10 microamperes could be controlled successfully and the voltage across $C_R$ could swing 5 volts, the required capacitance for $C_R$ in FIG. 2 would be $$C_R = I * dT/dV = 10^{-5} * 10^{-3}/5 = 2000 pF \quad \text{(Eq. 2)}$$

which is too large for monolithic realization. Larger current signals would require an even larger capacitor $C_R$.

The loop filter 24 in a phase-locked loop is needed both to remove spurious signals that might be generated in the phase detector 22 and to ensure the stability of the feedback loop under circumstances where the loop gain is high. To obtain adequate signal attenuation at $f_{REF}$, the loop filter must use an RC circuit having time constants greater than $1/(2*\pi*f_{REF})$. If the resolution of the synthesizer is high, $F_{REF}$ can be very low in frequency (e.g., less than 1 kilohertz). As a result, these time constants must be realized using discrete components (i.e., components external to an integrated circuit) because a well controlled resistor of the needed value is generally not available in an integrated circuit. For example, commercially available phase-locked loops require external loop filters.

It is known in the prior art that the response resulting from a long RC time constant can be emulated monolithically with a discrete time system that can be implemented using sampled-data circuit techniques. These techniques have been applied to the design of filters and data acquisition circuits, but have not heretofore been used to implement phase-locked loop systems. The reason for this is that the prior art teaches that the use of a sampled-data circuit in a phase-locked loop would adversely affect loop stability and introduce phase noise. In fact, if any of the conventional prior art phase detectors is used to drive a sampled-data loop filter, the sampling process will mix the higher harmonic components that are present at the phase detector's output down to dc, thereby introducing aliasing distortion in the phase error signal. This distortion can cause excess phase noise at the output and even instability in the feedback system.

The problems described above have precluded the effective implementation of a fully monolithic phase-locked loop. The present invention overcomes these problems by employing a new combination of a sampled-data phase detector and a sampled-data loop filter.

SUMMARY OF THE INVENTION

In summary, the present invention is a phase-locked loop circuit manufacturable using standard integrated circuit technology. The phase-locked loop includes a sampled-data phase detector, a sampled-data loop filter for filtering the output of the phase detector, a voltage controlled oscillator driven by the output of the loop filter, and a frequency divider in the feedback loop. A separate frequency acquisition circuit is used to prevent false locking of the phased-lock loop on an erroneous frequency. A clock circuit generates reference signals needed by the other circuit components.

The present invention includes a new sampled-data phase detector. This phase detector, under the control of two clocks of differing frequencies, derives a phase error signal through the use of discrete-time analog integration of its input signal. When the phase-locked loop is in lock, this phase detector outputs a valid phase error signal at discrete time intervals. The gain of the phase detector is proportional to a ratio of capacitor values, a ratio of frequencies, and a reference voltage, all of which can be made substantially independent of variations in temperature and semiconductor processing.

The phase detector of the preferred embodiment is not sensitive to frequency error at its inputs. Therefore, it is necessary to include an additional frequency acquisition circuit to prevent false locking of the phase-locked loop, especially if the output frequency of the voltage controlled oscillator is not predictable at power up. In this invention, a phase/frequency detector is used for purposes of frequency acquisition. The outputs of this detector are fed to the loop filter by means of a new switched-capacitor circuit arrangement that automatically removes the frequency acquisition circuit from the feedback loop once frequency acquisition has been achieved.

The present invention also includes a new monolithic sampled-data loop filter that can be readily implemented using standard integrated circuit technology. This loop filter emulates the response of continuous-time filters by replacing resistors with switched capacitors. The loop filter response is, to first order, a function only of capacitor ratios and the frequency of an externally referenced clock. Thus the response of the loop filter is independent of variations in temperature and processing.

BRIEF DESCRIPTION OF THE DRAWINGS

Additional objects and features of the invention will be more readily apparent from the following detailed description and appended claims when taken in conjunction with the drawings, in which:

DESCRIPTION OF THE PREFERRED EMBODIMENT

Figure 4:
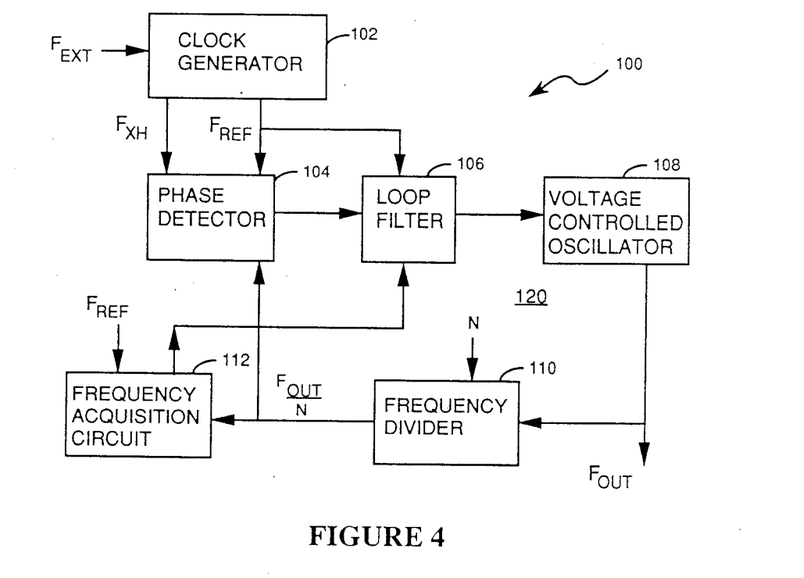
FIG. 4 is a block diagram of the preferred embodiment.

Referring to FIG. 4, the phase-locked loop circuit 100 of the present invention generates an output signal $F_{OUT}$ having a specified output frequency $f_{OUT}$ equal to $N*f_{REF}$, where N is preferably an integer and $f_{REF}$ is the frequency of a reference clock signal. The phase-locked loop circuit 100 has the following major components. A clock generator 102 generates two clock signals $F_{XH}$ and $F_{REF}$ from an external frequency reference $F_{EXT}$ such as might be derived from a crystal oscillator. Other types of standard clock reference sources could also be used.

These clock signals $F_{XH}$ and $F_{REF}$ are used by a sampled-data phase detector 104 as well as by an analog sampled data loop filter 106. A voltage controlled oscillator 108 generates an output signal $F_{OUT}$, which oscillates at a specified frequency corresponding to the filtered control signal generated by the loop filter 106. Frequency divider 110 divides the output signal $F_{OUT}$ by a specified number N, and forms a feedback loop which sends the resulting frequency divided signal $F_{OUT/N}$ to the phase detector 104 for comparison with the reference frequency signal $F_{REF}$. Finally, a frequency detector and acquisition circuit 112 is used to assist the circuit to lock onto the proper frequency whenever the circuit is turned on or the value of N is changed.

The new phase detector 104 and loop filter 106 differ from conventional continuous-time circuits in that the signals in these circuits only take on new values at discrete time intervals.

It should be noted that most phase detector circuits are not responsive to "frequency error" at their inputs. This means that the phase detector will not detect when one of the input signals is a harmonic of the other input signal. As a result, unless remedial action is taken, the phase-locked loop 120 can lock onto the wrong frequency.

When a phase detector which is not responsive to "frequency error" is used, it is necessary to use a second detector circuit for frequency acquisition.

Figure 5:
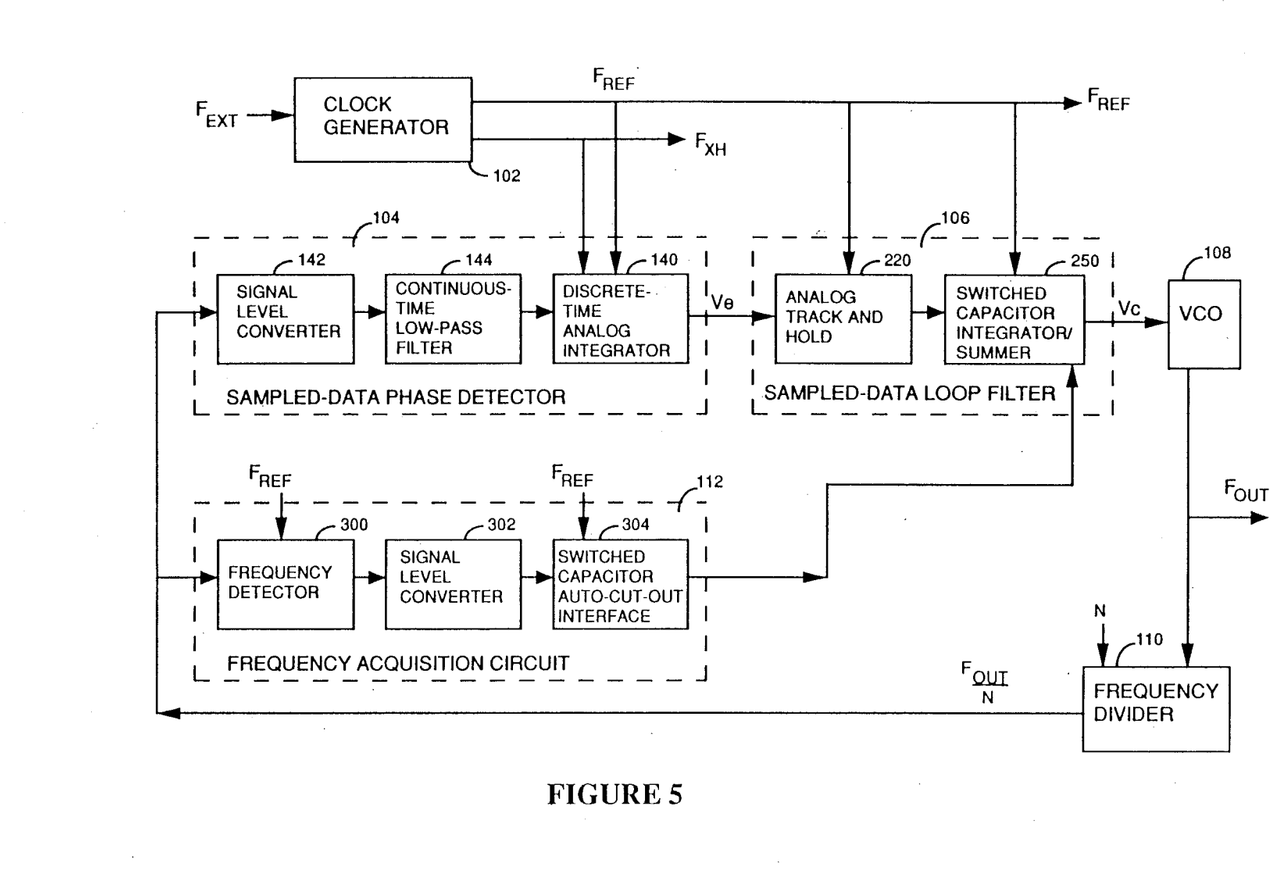
FIG. 5 is a more detailed block diagram of the preferred embodiment.
Figure 6:
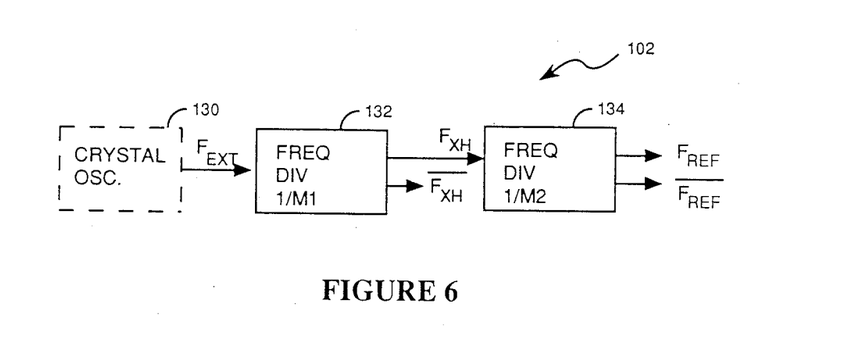
FIG. 6 is a block diagram of the clock circuit used in the preferred embodiment.
Figures 7, 7A:
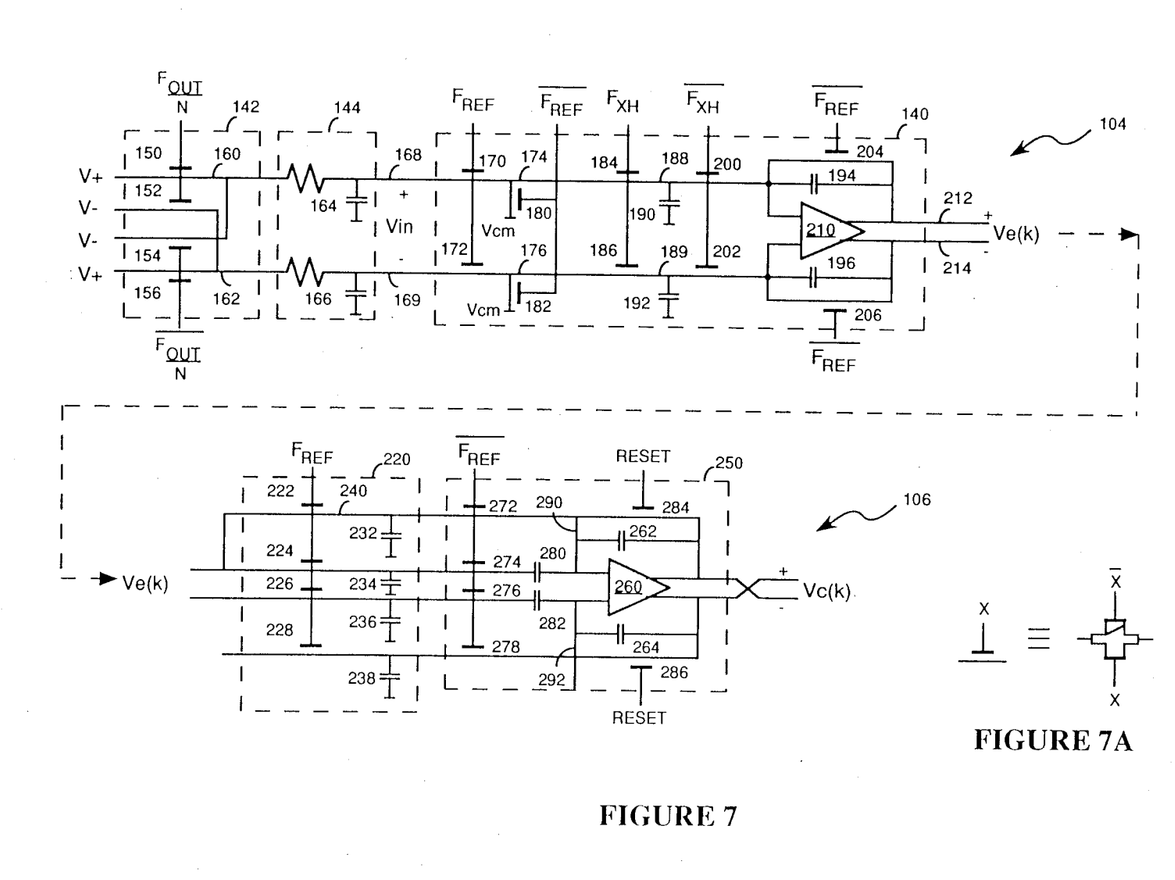
FIGS. 7 and 7A shows a detailed CMOS circuit implementation of the phase detector and loop filter of the preferred embodiment.
Figure 8:
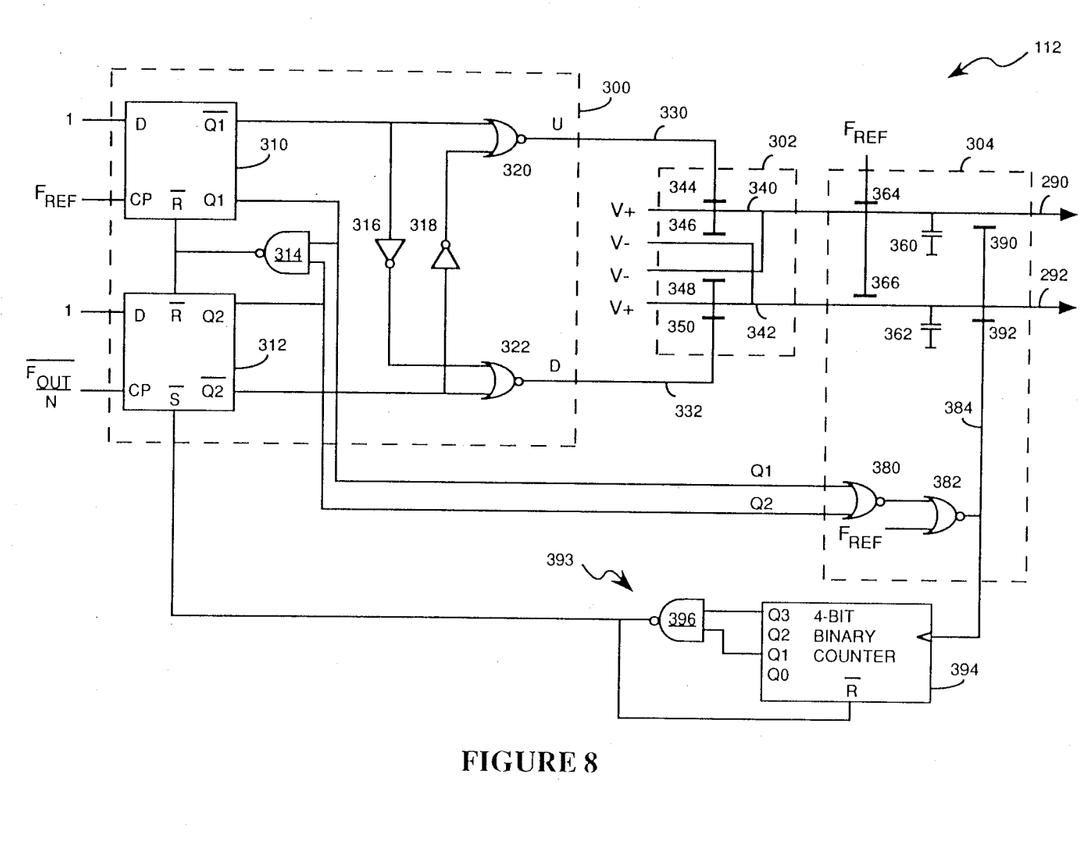
FIG. 8 shows a detailed CMOS circuit implementation of the frequency acquisition circuit of the preferred embodiment.

Referring to FIGS. 5 and 6, there is shown a more detailed functional block diagram of the preferred embodiment. FIGS. 7 and 8 illustrate the preferred embodiment as implemented in a CMOS monolithic circuit.

CLOCK GENERATOR

As shown in FIG. 6, the clock generator 102 comprises a cascade of two digital frequency dividers 132 and 134 driven by a reference frequency source 130. The first frequency divider 132 divides down the signal $F_{EXT}$, which may be generated by a crystal oscillator, by a factor of M1, and generates a pair of complementary clock signals $F_{XH}$ and $\overline{F_{XH}}$. The second frequency divider 134 divides the down the $F_{XH}$ clock signal by a factor of M2, and generates a second pair of complementary clock signals $F_{REF}$ and $\overline{F_{REF}}$. The two clock frequencies generated are $$f_{XH} = f_{EXT}/M1 \qquad \text{(Eq. 3)}$$

and $$f_{REF} = f_{EXT}/(M1*M2) \qquad \text{(Eq. 4)}$$

where $f_{EXT}$ is the frequency of the external reference signal $F_{EXT}$ and M1 and M2 are integers. Thus the two frequencies differ by an integer multiple M2, which is preferably an even integer. In general, the two frequencies should differ by at least a factor of four in order to allow for proper integration of the phase error by the phase detector; one preferred embodiment uses a factor of M2 equal to one hundred. Although the invention will still be functional if $F_{XH}$ and $F_{REF}$ are not related by an even integer multiple, lower output phase noise is obtained when they do in fact differ by an even integer multiple.

SAMPLED-DATA PHASE DETECTOR

Referring to FIG. 5, the signal $F_{OUT/N}$ which is used as an input to the phase detector 104 is a rectangular waveform generated by the frequency divider 110. Depending on the circuitry used, the voltage amplitude of the $F_{OUT/N}$ signal may exceed the voltage range of the analog circuits used to implement the discrete time integrator circuit 140 used in the phase detector 104. A signal level converter 142 is therefore used to translate the voltage level of the $F_{OUT/N}$ signal to a level appropriate for further processing. One implementation of the signal level converter 142, shown in FIG. 7, uses four CMOS switches 150-156 to switch the differential signals on nodes 160 and 162 alternately between V+ and V− under the control of the differential signals $F_{OUT/N}$ and $\overline{F_{OUT/N}}$. V+ and V− are reference voltages which may be generated on-chip using well known prior art techniques.

As shown in FIG. 7A, in the preferred embodiment, each switch in FIGS. 7 and 8 is implemented as a pair of CMOS transistors gated by complementary signals.

Following the signal level converter 142, the translated voltage signals on nodes 160 and 162 are low pass filtered, using a continuous time low pass filter 144 to improve the stability of the phase-locked loop by removing high frequency components of the translated voltage signals. The resulting differential signal on nodes 168 and 169 is called Vin.

The low pass filter 144 is implemented as two single pole RC filters 164 and 166 (see FIG. 7). The low pass filters 164 and 166 have a time constant of approximately $$RC = 1/f_{XH} \qquad \text{(Eq. 5)}$$

because the signals sampled by the discrete time integrator 140 are sampled at the frequency $f_{XH}$. This continuous time analog filter 144 is realizable monolithically because $f_{XH}$ can be significantly higher than $f_{REF}$ (e.g., $f_{XH}$ can be assigned a value well over 100 kilohertz).

Finally a phase error signal Ve(k) is generated by the discrete time analog time integrator 140 which samples the input signal Vin through CMOS switches 170 and 172 at a rate of $f_{XH}$. These samples are accumulated on nodes 174 and 176 in the integrator 140 as long as clock $F_{REF}$ remains high. When $F_{REF}$ goes low, CMOS switches 180 and 182 reset nodes 174 and 176 to a voltage level Vcm which is between voltage levels V+ and V−. At the same time, a valid phase error signal Ve(k) is output to the loop filter 106.

Switches 184 and 186 sample the complementary voltages at nodes 174 and 176 onto capacitors 190 and 192 (at nodes 188 and 189) when clock $F_{XH}$ goes high. The sampled charge is then transferred to integrating capacitors 194 and 196 by switches 200 and 202 when clock $F_{XH}$ goes low. This is repeated for as long as clock $F_{REF}$ remains high. When $F_{REF}$ goes low, switches 204 and 206 turn on, thereby discharging the integrating capacitors 194 and 196. Also, all input voltages to the inverting differential operational amplifier 210 are set to Vcm by switches 180 and 182. The signal at the output of the differential operational amplifier 210 at the falling edge of $F_{REF}$ represents the phase error signal that is sampled by the loop filter 106.

Figure 10:
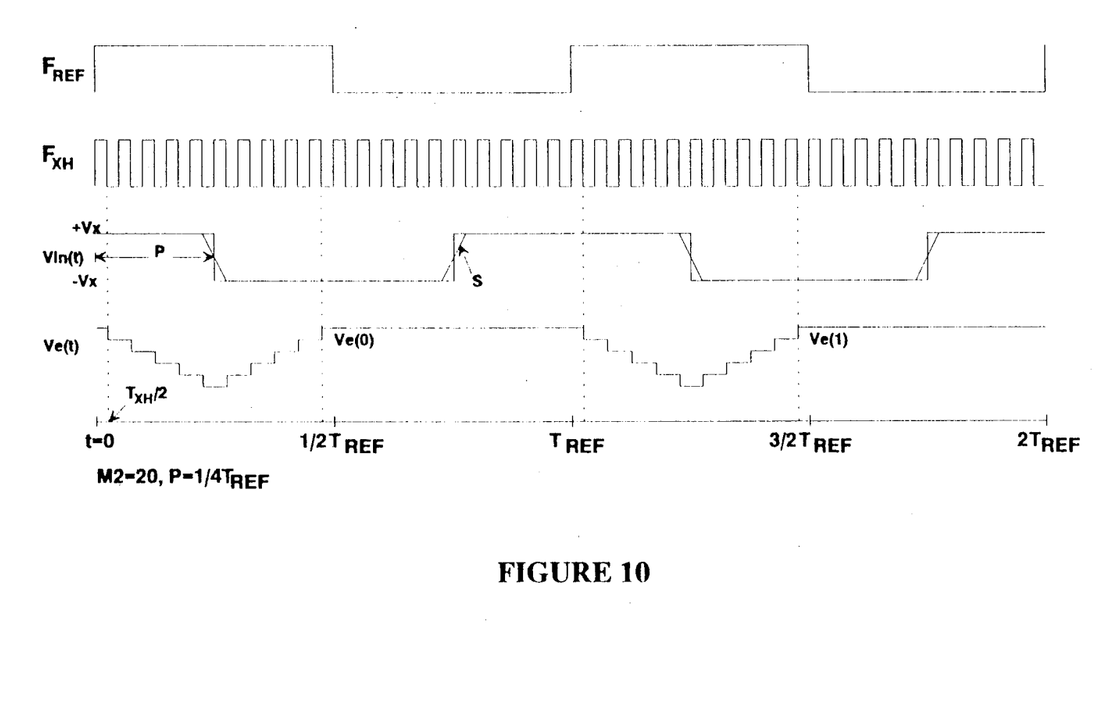
FIG. 10 is a timing diagram for one example of the sampled-data phase detector shown in FIG. 7.

A mathematical representation of the operation of the phase detector 104 can be derived by referring to FIG. 10. In this Figure, $t=0$ corresponds to the rising edges of both clock $F_{REF}$ and $F_{XH}$. The phase error voltage appears at the phase detector outputs 212 and 214 as a sampled analog signal Ve(k) at every falling edge of clock $F_{REF}$.

$$Ve(k) = Ve(k^*T_{REF} + \tfrac{1}{2}T_{REF}) \qquad \text{(Eq. 6)}$$

where $k = \{0, 1, 2, \ldots\}$ and $T_{REF}$ equals $1/f_{REF}$. Since this voltage is derived from the discrete time integration, or summation, of samples of the differential signal Vin $$Ve(k) = -\frac{C_{SP}}{C_{IP}} * \sum_{n=N1}^{N2} Vin(nT_{XH} + \tfrac{1}{2}T_{XH}) \qquad \text{(Eq. 7)}$$

where $T_{XH} = 1/f_{XH}$ is the clock period of clock $F_{XH}$. $C_{SP}$ is the capacitance of capacitors 190 and 192, and $C_{IP}$ is the capacitance of capacitors 194 and 196. N1 is the smallest positive integer and N2 is the largest positive integer that satisfy the following inequalities, because the samples are summed only when clock $F_{REF}$ is high:

$$N1^*T_{XH} + \tfrac{1}{2}T_{XH} \geq k^*T_{REF} \qquad \text{(Eq. 8)}$$

$$N2^*T_{XH} + \tfrac{1}{2}T_{XH} \leq k^*T_{REF} + \tfrac{1}{2}T_{REF}$$

or $$N1 = \text{lowest integer} \geq (k^*T_{REF} - \tfrac{1}{2}T_{XH})/T_{XH} \qquad \text{(Eq. 9)}$$

$$N2 = \text{highest integer} \leq (k^*T_{REF} + \tfrac{1}{2}T_{REF} - \tfrac{1}{2}T_{XH})/T_{XH}$$

Up to this point, no assumptions have been made concerning the relationship between $T_{REF}$ and $T_{XH}$. However, Ve(k) is a sum of $N2 - N1 + 1$ terms which is not a constant for all k if $T_{REF}$ is not an even integer multiple of $T_{XH}$. Thus, in general the gain of the phase detector is not constant and Ve(k) is modulated in time. However, this modulation is small when $T_{REF}$ is much larger than $T_{XH}$. To avoid phase noise at the output of the phase detector due to this modulation, it is best to choose $T_{XH}$ such that $$T_{REF} = M2^*T_{XH} \qquad \text{(Eq. 10)}$$

where M2 is an even integer (e.g., $M2 = 100$). Then it follows from Equations 9 and 10 above that $$N2 - N1 = \tfrac{1}{2}M2 - 1 \qquad \text{(Eq. 11)}$$

When the phase-locked loop is in lock, the input signal Vin is periodic and its frequency is forced to equal $f_{REF}$. Under this condition, it follows from Equations 7, 9 and 10 that $$\begin{aligned}
Ve(k) &= -\frac{C_{SP}}{C_{IP}} * \sum_{n=0}^{\tfrac{1}{2}M2-1} Vin(nT_{XH} + \tfrac{1}{2}T_{XH} + k^*T_{REF}) \\
&= -\frac{C_{SP}}{C_{IP}} * \sum_{n=0}^{\tfrac{1}{2}M2-1} Vin(nT_{XH} + \tfrac{1}{2}T_{XH})
\end{aligned} \qquad \text{(Eq. 12)}$$

Figure 11:
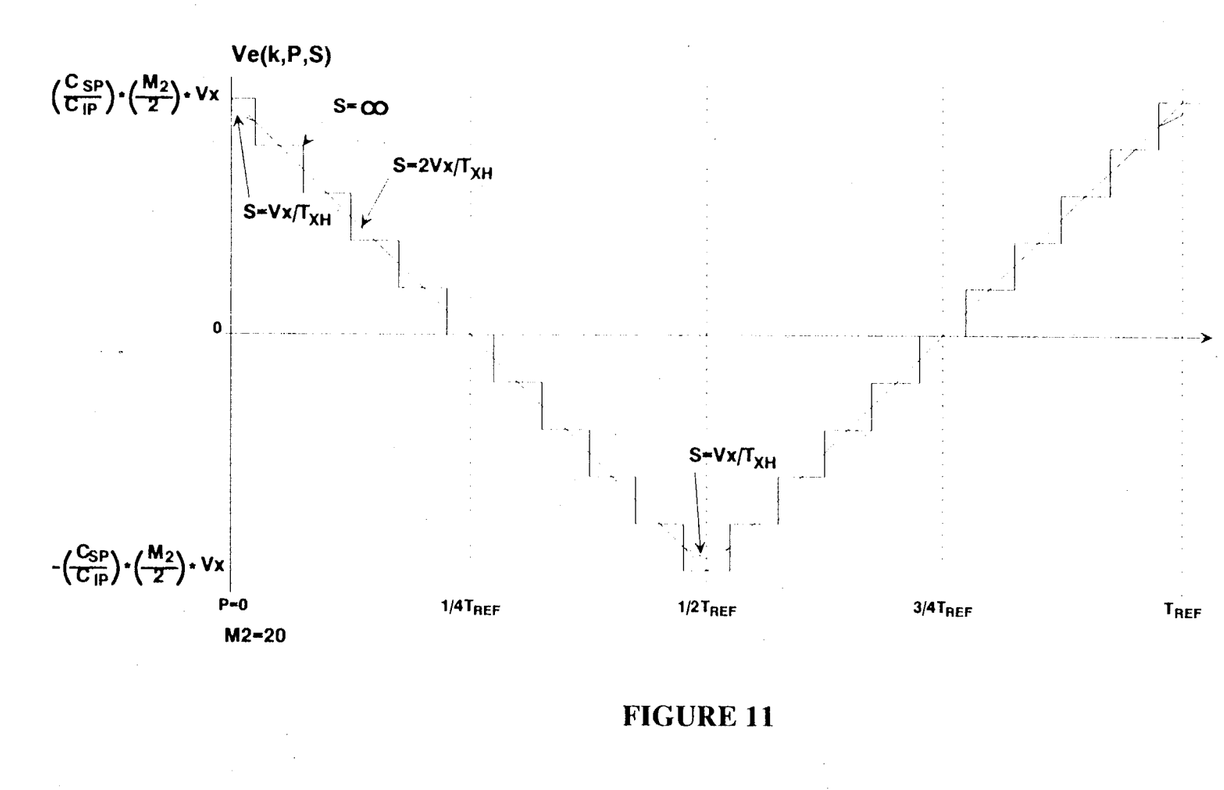
FIG. 11 shows the dc transfer characteristics of the sampled-data phase detector shown in FIG. 7.

Vin(t) can be approximated by a periodic pulse waveform with finite rise and fall times. Referring to FIG. 10 and using the following piecewise-linear approximation $$Vin(t) = \begin{cases} Vx & 0 < t < P - Vx/S \\ -1*S*(t - P) & P - Vx/S < t < P + Vx/S \\ -1*Vx & P + Vx/S < t < P + \tfrac{1}{2}T_{REF} - Vx/S \\ S*(t - P - \tfrac{1}{2}T_{REF}) & P + \tfrac{1}{2}T_{REF} - Vx/S < t < P + \tfrac{1}{2}T_{REF} - Vx/S \\ Vx & P + \tfrac{1}{2}T_{REF} + Vx/S < t < T_{REF} \end{cases} \quad \text{(Eq. 13)}$$

where Vx is the peak value of the differential voltage Vin (i.e., Vx={V+}−{V−}), S is the rising/falling slope of the pulse waveform (i.e., the rate of change of Vin), and P is the phase of Vin, defined as the time when the first zero-crossing occurs. Equations 12 and 13 can be evaluated numerically as functions of P, for different values of S. The results of such an evaluation for three different values of S are plotted in FIG. 11. When the rate of change in Vin is $$S = 2Vx/T_{XH} \quad \text{(Eq. 14)}$$

the dc transfer characteristic of the phase detector is a periodic triangular function of time or phase, as indicated in FIG. 11. The gain $K_{PD}$ of the phase detector for this case, in volts/sec, is $$K_{PD} = 2 * \frac{C_{SP}}{C_{IP}} * M2 * \frac{Vx}{T_{REF}} \quad \text{(Eq. 15)}$$

The gain $K_{PD}$ is thus a function of the capacitor ratio $C_{SP}/C_{IP}$, the frequency divisor M2, an on chip reference voltage Vx and the period of the reference frequency $T_{REF}$. Note that in this case the gain of the phase detector is constant with respect to phase. All of these parameters can be made, to first order, independent of variations in temperature and processing.

As the rate of change in Vin increases (i.e., $Vx/S < < T_{XH}$), distinct steps appear in the dc transfer characteristic of the phase detector. FIG. 11 shows the dc transfer characteristic when S approaches infinity. In this case, the local gain of the phase detector varies with the phase of the Vin signal. The local gain of the phase detector at $P = (n + \tfrac{1}{2})*T_{XH}$ for an integer n approaches infinity, thereby causing instability of the feedback loop. Also, in this situation the local gain of the phase detector is zero between the unstable points, with a frequency of oscillation dependent on both the loop filter gain and the VCO gain. As a result, the design of the loop should clearly be such that S is always less than or equal to $2Vx/T_{XH}$.

Also shown in FIG. 11 is a third case where $$S = Vx/T_{XH} \quad \text{(Eq. 16)}$$

In this case the phase detector transfer characteristic is altered from that corresponding to Equation 14 only to the extent that the local gain is reduced at the peaks of the triangular waveform in the neighborhood of $P = n*\tfrac{1}{2}T_{REF}$. This reduction is inconsequential because the detector normally operates in the region near the points $P = n*T_{REF}/4$.

In the embodiment depicted in FIG. 7, two single pole RC filters 164 and 166 are used to limit the rise and fall times of the signal Vin(t), thereby controlling the value of S. The accuracy of the time constants of these filters is unimportant as long as those time constants remain greater than $T_{XH}$. Moreover, these time constants are realizable monolithically because $T_{XH}$ can be readily made less than 10 microseconds (corresponding to a frequency $f_{XH}$ exceeding 100 kilohertz) with standard integrated circuit components. The lower limit on $T_{XH}$ is governed by the settling time of the operational amplifier.

SAMPLED-DATA LOOP FILTER

Figure 9:
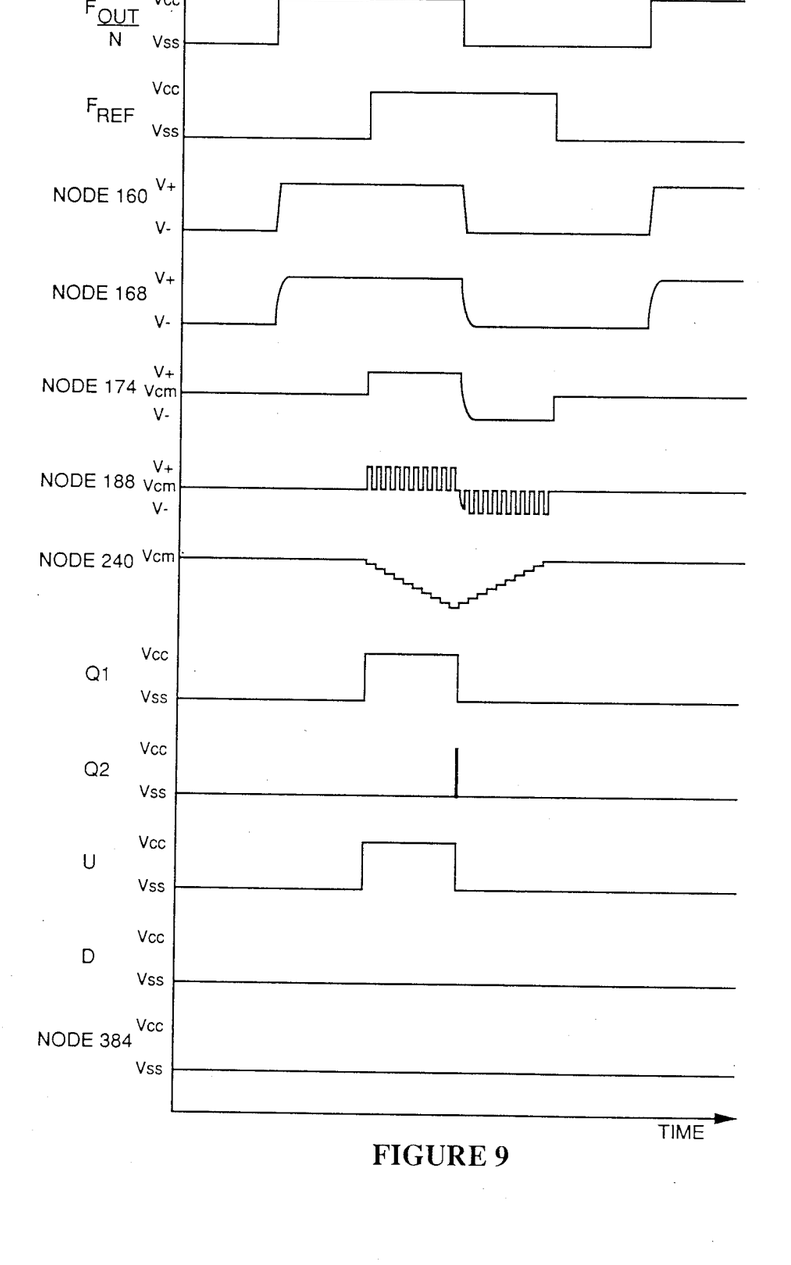
FIG. 9 is a timing diagram for the circuits shown in FIGS. 6-8.

In FIGS. 5 and 7, the phase error signal Ve(k) appears at the output of the phase detector 104 as a sampled-data signal that is transmitted to the loop filter 106. Since Ve(k) is a valid error signal only after the falling edge of clock $F_{REF}$ it must first be sampled and held at the loop filter's input. A track and hold circuit 220 is used for this purpose. As shown in FIG. 7, the Ve(k) signal is sampled by switches 222, 224, 226 and 228 and held on capacitors 232, 234, 236 and 238. As clock $F_{REF}$ goes high, these sampled signals are passed on to the loop filter to generate the VCO control signal Vc(k). The timing diagram in FIG. 9 shows the waveform of node 240. This waveform tracks Ve(k) only while clock $F_{REF}$ is high.

Referring again to FIG. 7, the track and hold circuit 220 is followed by a sampled-data integrator/summer 250 that generates the VCO control voltage Vc(k). The integrator/summer 250 can also be thought of as a sampled-data analog filter. The transfer function of this filter can be specifically designed to match the requirements of the phase-locked loop. For example, a second-order phase-locked loop would require a first-order filter transfer function. Because of its discrete-time nature, this type of loop filter is realizable monolithically using sampled-data analog circuit techniques. In the CMOS implementation shown in FIG. 7 the filter 250 is implemented as a first-order switched capacitor filter. Operational amplifier 260, integrating capacitors 262 and 264, sampling capacitors 232–238, complementary switches 272–278, and coupling capacitors 280 and 282 form a differential switched-capacitor integrator/summer. The VCO control voltage is given by:

$$\begin{aligned} Vc(k + 1) &= Vc(k*T_{REF} + T_{REF}) \quad \text{(Eq. 17)} \\ &= \frac{C_{SL1}}{C_{IL}} * \sum_{n=0}^{k} Ve(n) + \\ &\quad \frac{C_{SL2}}{(C_{SL2} + C_{CL})} * \frac{C_{CL}}{C_{IL}} * Ve(k) \end{aligned}$$

where k equals {0, 1, 2, 3, . . . }, and $C_{SL1}$, $C_{IL}$, $C_{SL2}$, and $C_{CL}$ are the capacitances of capacitor pairs (232, 238), (262, 264), (234, 236) and (280, 282), respectively. Since only capacitor ratios appear as coefficients in Equation 17, the characteristics of this loop filter are insensitive even to severe variations in temperature and processing.

Switches 284 and 286 and the RESET signal are used to reset the loop filter 106 when the circuit is first powered up.

AUTOMATIC CUT-OUT FREQUENCY ACQUISITION CIRCUIT

Without a special frequency acquisition circuit, the capture range of a phase-locked loop implemented with the phase detector and loop filter described above is approximately $$f_{CAP} \sim \frac{C_{SL2}}{(C_{SL2} + C_{CL})} \cdot \frac{C_{CL}}{C_{IL}} \cdot \frac{C_{SP}}{C_{IP}} \cdot M2 \cdot V_x \cdot K_{VCO} \quad \text{(Eq. 18)}$$

where $K_{VCO}$ is the voltage to frequency gain of the VCO 108 and $f_{CAP}$ is the width of the capture range in hertz around the VCO's output frequency. Depending on the size of the capacitor ratios in Equation 18, the capture range may be much smaller than the frequency range of the VCO 108. In this case, if a frequency to be synthesized is outside the capture range, then the phase-locked loop will fail to generate the desired frequency. This problem is especially severe if the free-running frequency of the VCO 108 is not well controlled, because the phase-locked loop may falsely lock onto a subharmonic or harmonic of the specified frequency during system power up. Because of this difficulty, a frequency acquisition circuit 112 is used in the preferred embodiment, as shown in FIG. 5. The output of this circuit 112 is fed directly to nodes 290 and 292 at the inputs of the operational amplifier 260 in the sampled-data loop filter 106.

In the frequency acquisition circuit 112 as shown in FIG. 5, a frequency detector 300 is used to compare the frequency at the output of frequency divider 110 to the reference frequency $f_{REF}$. A digital signal generated on the output of the frequency detector 300 then indicates whether the frequency error is positive, negative or zero. This digital signal is then converted to a suitable voltage level by a signal level converter 302, and then coupled to the loop filter 106 by a switched-capacitor automatic cut-out interface 304.

A preferred embodiment of the frequency acquisition circuit 112 is shown in FIG. 8. Frequency detector 300 consists of two flip-flops 310 and 312, together with NAND gate 314, inverters 316 and 318, and NOR gates 320 and 322. This simple circuit has been used as the phase detector in at least one commercially available phase-locked loop, and thus its function need not be described in detail.

In previous applications, this circuit 300 has been used to detect both phase error and frequency error. In the present invention, however, it is being used only for frequency acquisition. A pair of binary output signals (U,D) appearing on nodes 330 and 332 control the frequency of the VCO 108.

Figure 12:
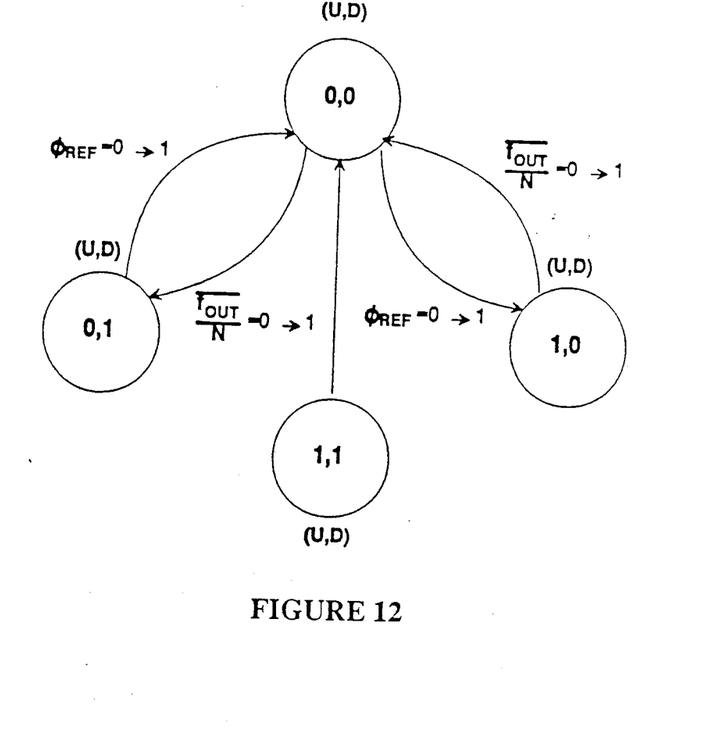
FIG. 12 is a state diagram for the frequency detector circuit shown in FIG. 8.

Referring to FIG. 12, there are three valid logic states of the U and D output signals. The state (U,D)=(1,0) indicates that $f_{OUT/N}$ is less than $f_{REF}$ and that, as a consequence, the VCO frequency should be increased. The state (U,D)=(0,1) indicates that $f_{OUT/N}$ is greater than $f_{REF}$ and that, as a consequence, the VCO frequency should be decreased. The state (U,D)=(0,0) indicates that both the frequency error and phase error have approached zero and that therefore the VCO frequency should be left unchanged. State (U,D)=(1,1) is not an allowed state. The outputs U and D change state on the rising edge of either clock $F_{REF}$ or clock $F_{OUT/N}$ according to the state transition diagram in FIG. 12.

As shown in FIGS. 5 and 8, the output of the frequency detector 300 is fed to a signal level converter 302 that is functionally identical to the signal level converter 142 in the phase detector. The digital signal levels appearing at the input to the signal level converter 302 are translated to a set of levels appropriate for further processing by loop filter 106. The differential signals on nodes 340 and 342 are driven to V+ and V− alternately by switches 344, 346, 348 and 350, which are controlled by the output signals U and D of the frequency detector 300.

Finally, the outputs of the signal converter 302 are sampled with a switched capacitor circuit 304 that converts the voltage signals on nodes 340 and 342 to charge stored on capacitors 360 and 362. This charge is then passed on to nodes 290 and 292 of the sampled-data loop filter 106 at the falling edge of clock $F_{REF}$. The differential signals at nodes 340 and 342 are passed by switches 364 and 366 and sampled at the falling edge of clock $F_{REF}$ onto capacitors 360 and 362.

NOR gates 380 and 382 put a high voltage on node 384 at the falling edge of clock $F_{REF}$ only if a frequency error has been detected. The high voltage on node 384 enables transfer switches 390 and 392 so that the stored charge on capacitors 360 and 362 is then integrated by the loop filter 106. If no frequency error is detected, switches 390 and 392 are disabled and the frequency acquisition circuit 112 does not affect the operation of the loop filter 106.

Without a feedback circuit 393, the frequency acquisition circuit 112 still preforms proper frequency acquisition for the PLL circuit 100. However, the PLL circuit can operate at one of two stable operating points after frequency acquisition is achieved. The first operating point corresponds to $P=\frac{1}{4}T_{REF}$ and the second operating point corresponds to $P=\frac{3}{4}T_{REF}$ (see FIGS. 10 and 11). Feedback circuit 393 is included to force the PLL circuit 100 to always operate at the first operating point $(P=\frac{1}{4}T_{REF})$, which corresponds to the timing diagram in FIG. 9. The feedback circuit 393 includes a binary counter 394 clocked by the signal on line 364 and a NAND gate 396 having its two inputs coupled to the Q3 and Q1 outputs of the counter 394. The output of the NAND gate 396 is coupled to flip-flop 312 so that when the output of the NAND gate 396 goes low, flip-flop 312 is set. The low going output of the NAND gate 396 also resets the counter 394. In this configuration the binary counter 394 is reset asynchronously after a terminal count of ten (1010 binary) is reached. Other terminal count values could be used.

FREQUENCY DIVIDER AND VCO

Figure 13:
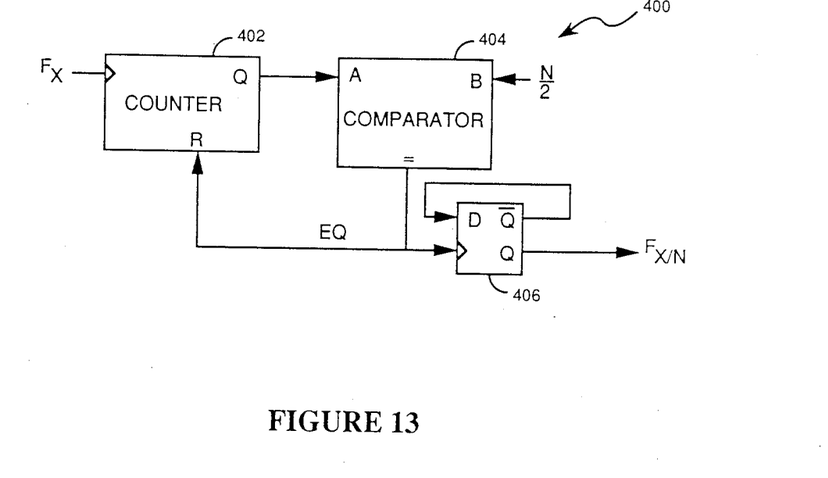
FIG. 13 shows a typical implementation of the frequency dividers shown in FIGS. 4 and 6.

A number of monolithic frequency dividers are well known in the prior art and can be used in the monolithic phase-locked loop circuit of the present invention. FIG. 13 shows a preferred embodiment of a frequency divider 400 that divides the frequency of an input signal $F_X$ by an even integer N. The frequency divider has a counter 402 that is clocked by $F_X$, and comparator 404 that compares the output value of the counter 402 with the value of N/2 and generates an output signal EQ when the output value of the counter 402 and N/2 are equal. A flip flop 406 that is set up to change output values every time the comparator 404 outputs an EQ signal, thereby generating an output signal $F_{X/N}$ that has a frequency of 1/N times the frequency of the $F_X$ signal. The EQ signal also resets the counter 402 to a value of zero so that the counter 402 will beginning counting the next half-cycles of the $F_{X/N}$ signal.

When N is a integer, but not an even integer, the counter 402 can be set up to count on both the up and down transitions of $F_X$, and the comparator 404 can be set up to compare the counter output with N.

The VCO 108 can be implemented using any one of a number of monolithic voltage controlled oscillators known in the prior art. For instance, one preferred embodiment uses a voltage controlled oscillator similar to the one shown in Giebel, B., Lutz, J., and O'Leary, P. L., "Digitally Controlled Oscillator," IEEE Journal of Solid-State Circuits, vol. 24, no. 6, pp. 640–645 (June 1989). The particular VCO circuit used is not critical to implementing the present invention.

ALTERNATE EMBODIMENTS

While the preferred embodiment uses CMOS integrated circuitry, the present invention could also be implemented with NMOS integrated circuitry, bipolar-CMOS (BiCMOS) integrated circuitry, and probably even bipolar integrated circuitry. The particular design of the phase detector and other circuits could be varied in a large number of ways. For instance, the RC filters 164 and 166 could have been placed further downstream in the phase detector without changing its overall operation. The switched-capacitor integrator/summer 250 and the discrete-time analog integrator 140 can be implemented in a number of well known alternate circuit topologies which have minor advantages (e.g., stray insensitivity) over the preferred embodiment described herein.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

What is claimed is:

1. A phase-locked loop circuit, comprising:
   a sampled-data phase detector which detects phase error between a reference clock signal and a second signal and generates a phase error signal; said sampled-data phase detector including integrating means which repeatedly samples and integrates said second signal while said reference clock signal is in a predefined portion of its clock cycle, thereby generating said phase error signal;
   sampled-data loop filter means, coupled to said sampled-data phase detector, for low pass filtering said phase error signal and for generating a filtered control signal;
   voltage controlled oscillator means, coupled to said sampled-data loop filter means, for generating an output signal which oscillates at a frequency corresponding to said filtered control signal; and
   frequency divider means, coupled to said voltage controlled oscillator means and said sampled-data phase detector, for dividing said output signal and thereby generating said second signal, said second signal oscillating at a lower frequency than said output signal.

2. The phase-locked loop circuit of claim 1, further including
   frequency acquisition means, coupled to said loop filter means, for generating a frequency error signal corresponding to the frequency difference, if any, between said reference clock signal and said second signal; and
   means for coupling said frequency acquisition means to said loop filter means so as to govern the output of said loop filter means when a frequency difference is detected by said frequency acquisition means.

3. The phase-locked loop circuit of claim 1, further including
   frequency acquisition means, coupled to said loop filter means, for generating a frequency error signal corresponding to the frequency difference, if any, between said reference clock signal and said second signal; and
   means for coupling said frequency acquisition means to said loop filter means so as to govern the output of said loop filter means when a frequency difference is detected by said frequency acquisition means and for isolating said frequency acquisition means from said loop filter means when no frequency difference is detected by said frequency acquisition means.

4. The phase-locked loop circuit of claim 1, further including
   clock means, coupled to said sampled-data phase detector and said sampled-data loop filter means, for generating said reference clock signal and a second clock signal, said reference and second clock signals oscillating at distinct first and second frequencies;
   said sampled-data loop filter means including sampling means for sampling the phase error signal produced by said integrating means at the end of said predefined portion of said reference clock signal's cycle, means for combining said sampled phase error signal with previously sampled phase error signals, and means for amplifying the resulting combined samples of said phase error signals to produce said filtered control signal.

5. The phase-locked loop circuit of claim 4, wherein said second frequency exceeds said first frequency by at least a factor of four.

6. The phase-locked loop circuit of claim 5, wherein said first and second frequencies differ by a factor that is equal to an even integer.

7. The phase-locked loop circuit of claim 1,
   said sampled-data phase detector further including
     continuous time low-pass filter means for low-pass filtering said second signal; whereas
   said integrating means, coupled to the output of said continuous time low-pass filter means, for integrating said second signal.

8. The phase-locked loop circuit of claim 1,
   said sampled-data phase detector further including
     signal level converter means for converting the signal level of said second signal to a predefined voltage range; and
     continuous time low-pass filter means, coupled to said signal level converter means, for low-pass filtering the signal output of said signal level converter means and for generating a filtered signal; whereas
   said integrating means, coupled to the output of said continuous time low-pass filter means, for integrating said filtered signal 9. The phase-locked loop circuit of claim 7, said sampled-data loop filter means including sampling means for sampling the phase error signal produced by said integrating means at the end of said predefined portion of said reference clock signal's cycle, means for combining said sampled phase error signal with previously sampled phase error signals, and means for amplifying the resulting combined samples of said phase error signals to produce said filtered control signal.

10. The phase-locked loop circuit of claim 1,
said sampled-data loop filter means including sampling means for sampling the phase error signal produced by said sampled-data phase detector, means for combining said sampled phase error signal with previously sampled phase error signals, and means for amplifying the resulting combined samples of said phase error signals to produce said filtered control signal.

11. A phase-locked loop circuit, comprising:
phase detector means for detecting phase error between a reference clock signal and a second signal and for generating a phase error signal;
sampled-data loop filter means, coupled to said phase detector means, for sampling the phase error signal produced by said phase detector means at discrete points in time, low pass filtering said sampled phase error signal and generating a filtered control signal;
voltage controlled oscillator means, coupled to said sampled-data loop filter means, for generating an output signal which oscillates at a frequency corresponding to said filtered control signal; and
frequency divider means, coupled to said voltage controlled oscillator means and said phase detector means, for dividing said output signal and thereby generating said second signal, said second signal oscillating at a lower frequency than said output signal.

12. The phase-locked loop circuit of claim 11, wherein said phase detector means, sampled-data loop filter means, voltage controlled oscillator means and frequency divider means comprise portions of a single monolithic integrated circuit.

13. The phase-locked loop circuit of claim 11, further including
frequency acquisition means, coupled to said loop filter means, for generating a frequency error signal corresponding to the frequency difference, if any, between said reference clock signal and said second signal; and
means for coupling said frequency acquisition means to said loop filter means so as to govern the output of said loop filter means when a frequency difference is detected by said frequency acquisition means.

14. The phase-locked loop circuit of claim 13, wherein said phase detector means, frequency acquisition means, sampled-data loop filter means, voltage controlled oscillator means and frequency divider, means comprise portions of a single monolithic integrated circuit.

15. The phase-locked loop circuit of claim 11,
said sampled-data loop filter means including, means for combining said sampled phase error signal with previously sampled phase error signals, and means for amplifying the resulting combined samples of said phase error signals to produce said filtered control signal.

16. The phase-locked loop circuit of claim 15, wherein said phase detector means, sampled-data loop filter means, voltage controlled oscillator means and frequency divider means comprise portions of a single monolithic integrated circuit.

17. A fully monolithic phase-locked loop integrated circuit, comprising:
sampled-data phase detector means for detecting phase error between a reference clock signal and a second signal and for generating a phase error signal; said sampled-data phase detector including integrating means which repeatedly samples and integrates said second signal while said reference clock signal is in a predefined portion of its clock cycle, thereby generating said phase error signal;
sampled-data loop filter means, coupled to said sampled-data phase detector means, for low pass filtering said phase error signal and for generating a filtered control signal;
voltage controlled oscillator means, coupled to said sampled-data loop filter means, for generating an output signal which oscillates at a frequency corresponding to said filtered control signal;
frequency divider means, coupled to said voltage controlled oscillator means and said sampled-data phase detector means, for dividing said output signal and thereby generating said second signal, said second signal oscillating at a lower frequency than said output signal;
wherein said sampled-data phase detector means, sampled-data loop filter means, voltage controlled oscillator means and frequency divider means comprise portions of a single monolithic integrated circuit.

18. The integrated circuit of claim 17, further including
frequency acquisition means, coupled to said sampled-data loop filter means, for generating a frequency error signal corresponding to the frequency difference, if any, between said reference clock signal and said second signal; and
means for coupling said frequency acquisition means to said sampled-data loop filter means so as to govern the output of said sampled-data loop filter means when a frequency difference is detected by said frequency acquisition means.

19. The integrated circuit of claim 17, further including
clock means, coupled to said sampled-data phase detector means and said sampled-data loop filter means, for generating said reference clock signal and a second clock signal, said reference and second clock signals oscillating at distinct first and second frequencies; and
said sampled-data loop filter means including sampling means for sampling the phase error signal produced by said integrating means at the end of said predefined portion of said reference clock signal's cycle, means for combining said sampled phase error signal with previously sampled phase error signals, and means for amplifying the resulting combined samples of said phase error signals to produce said filtered control signal.

20. The integrated circuit of claim 19, wherein said first and second frequencies differ by a factor that is equal to an even integer.

21. The integrated circuit of claim 17,
said sampled-data phase detector further including continuous time low-pass filter means for low-pass filtering said second signal; and said integrating means, coupled to the output of said continuous time low-pass filter means, for integrating said second signal.

22. The integrated circuit of claim 17, said sampled-data loop filter means including sampling means for sampling the phase error signal produced by said sampled-data phase detector means, means for combining said sampled phase error signal with previously sampled phase error signals, and means for amplifying the resulting combined samples of said phase error signals to produce said filtered control signal.

23. A sampled-data phase detector circuit which detects phase error between a reference clock signal and an input signal, comprising:

means for providing a reference clock signal and an input signal;

integrating means for integrating said input signal while said reference clock signal is in a predefined portion of its clock cycle, thereby generating a phase error signal; and sampling means coupled to said integrating means for sampling said phase error signal at the end of said predefined portion of the clock cycle of said reference clock signal.

24. The sampled-data phase detector circuit set forth in claim 23, further including continuous time low-pass filter means for low-pass filtering said input signal and generating a filtered signal;

said integrating means including means, coupled to said continuous time low-pass filter means, for integrating said filtered signal while said reference clock signal is in a predefined portion of its clock cycle.

* * * * *